US 6,825,652 B2

(12) United States Patent
Zhao et al.

(10) Patent No.: US 6,825,652 B2
(45) Date of Patent: Nov. 30, 2004

(54) TESTER INCORPORATING OPENING AND CLOSING MECHANISM

(75) Inventors: Yue Qing Zhao, Shenzhen (CN); Lin Yan, Shenzhen (CN); Tai Ping Zhou, Shenzhen (CN); Ga Lei Hu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/316,520

(22) Filed: Dec. 10, 2002

(65) Prior Publication Data

US 2004/0041557 A1 Mar. 4, 2004

(30) Foreign Application Priority Data

Sep. 3, 2002 (TW) ...................................... 91213807 U

(51) Int. Cl.[7] .............................................. G01R 31/02
(52) U.S. Cl. .................................. 324/158.1; 324/754
(58) Field of Search ............................ 324/158.1, 73.1, 324/754, 757, 761

(56) References Cited

U.S. PATENT DOCUMENTS 2,918,648 A * 12/1959 Ludman et al. ............. 439/711
4,812,754 A *  3/1989 Tracy et al. ................. 324/754
5,831,160 A * 11/1998 Steketee ...................... 73/431
5,894,225 A *  4/1999 Coffin ......................... 324/762

* cited by examiner

Primary Examiner—Ernest Karlsen
(74) Attorney, Agent, or Firm—Wei Te Chung

(57) ABSTRACT

A tester incorporating an opening and closing mechanism includes a base (10), a cover (30) pivotably attached to the base, and a pair of master cylinders (40) pivotably attached to the base and cover. The base includes a top wall (12) and a control panel (18). Three spaced lower hooks (14) are formed on the top wall. A first sensor is mounted on one lower hook. A pair of actuators (16) is mounted behind two lower hooks. The control panel receives and sends signals. Three spaced upper hooks (34) are pivotably fixed on the cover, for engaging with the lower hooks respectively. A second sensor is mounted on the cover behind one upper hook. A third sensor (41a) is mounted on one master cylinder. The master cylinders and the actuators are controlled by the control panel, for opening and closing the cover.

10 Claims, 2 Drawing Sheets

US 6,825,652 B2

TESTER INCORPORATING OPENING AND CLOSING MECHANISM

BACKGROUND OF THE INVENTION

1. Field of the Invention

The present invention relates to testing machines, and more particularly to testers which have a mechanism for quick and steady opening and closing thereof.

2. Description of the Related Art

A typical tester used for testing apparatuses such as printed circuit boards comprises a cover and a base. A control panel is formed on a front wall of the base. A retaining device is formed on a top wall of the base, for retaining a printed circuit board to be tested. The cover is parallelepiped-shaped. The cover is pivotably attached to the base, for covering the base. A testing device is provided in the cover. A knob is formed on a front wall of the cover, for opening and closing the cover. When testing a printed circuit board, an operator has to lift the cover open by the knob, fix the printed circuit board on the retaining device, and close the cover to start the test. However, such manual operation is slow, laborious and inefficient. Furthermore, if the operator opens or closes the cover too quickly, the testing device in the cover is liable to sustain damage due to shock. Accuracy of the tester may then be impaired.

SUMMARY OF THE INVENTION

Accordingly, an object of the present invention is to provide a tester which has a stable automatic opening and closing mechanism.

Another object of the present invention is to provide a tester which reduces manual labor and increases efficiency.

To achieve the above objects, a tester incorporating an opening and closing mechanism in accordance with the present invention comprises a base, a cover, a pair of first cylinders and a pair of second cylinders. The base comprises a top wall and a control panel. Three aligned and spaced lower hooks are upwardly formed on the top wall adjacent the control panel. A first sensor is mounted on a middle one of the lower hooks. The first sensor sends signals to the control panel. A pair of actuators is mounted behind the two hooks that are at apposite sides of the middle lower hook. The control panel receives and sends signals. The cover is pivotably attached to the base. Three aligned and spaced upper hooks are pivotably fixed on the cover, for engaging with the lower hooks respectively. A second sensor is mounted on the cover behind a middle one of the upper hooks. The second sensor of the cover sends signals to the control panel. Each of the first cylinders comprises a cylinder casing and a piston rod. The first cylinders are pivotably attached to the base and the cover. A third sensor is mounted on an outer surface of one first cylinder. The third sensor of the first cylinder sends signals to the control panel. The first cylinder, the second cylinders and the actuators are controlled by the control panel, for opening and closing the cover.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
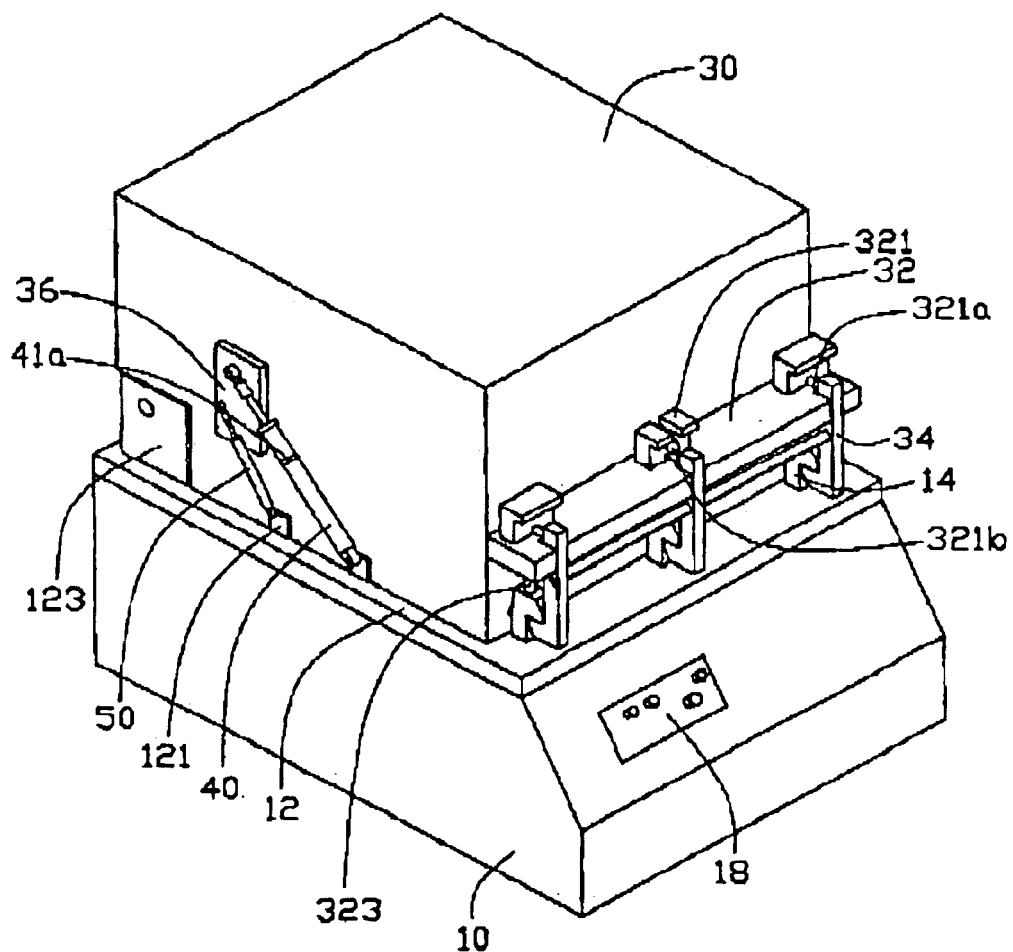
FIG. 1 is an isometric view of a tester in accordance with a preferred embodiment of the present invention, showing the tester in a closed position.
Figure 2:
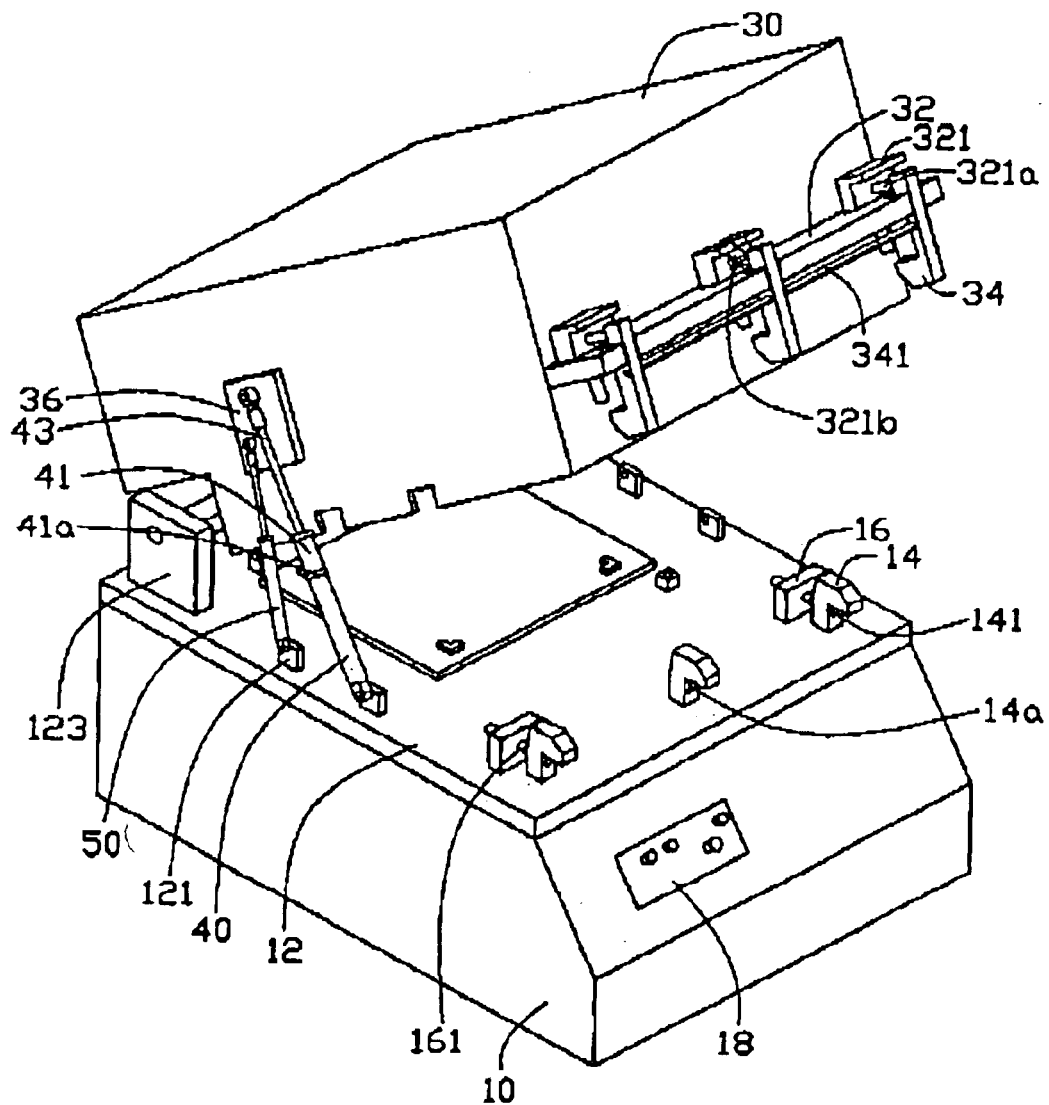
FIG. 2 is similar to FIG. 1, but showing the tester in an open position.

Referring to FIGS. 1 and 2, a tester incorporating an opening and closing mechanism in accordance with a preferred embodiment of the present invention comprises a base 10, a cover 30, a pair of first cylinders 40 and a pair of second cylinders 50.

The base 10 comprises a top wall 12 and a control panel 18. The control panel 18 is arranged at a front wall of the base 10, and is for receiving and sending signals. The top wall 12 is for supporting a printed circuit board (not shown) to be tested. Three aligned and spaced lower hooks 14 are upwardly formed at a front portion of the top wall 12. Each lower hook 14 is L-shaped, and comprises a vertical part and a horizontal part. A first sensor 14a is mounted on the vertical part and under the horizontal part of a middle one of the lower hooks 14. The first sensor 14a sends signals to the control panel 18. A pair of actuators 16 is respectively positioned behind the two lower hooks 14 that are at opposite sides of the middle lower hook 14. Each actuator 16 comprises a slidable shaft 161 extending through a middle part thereof. A pair of holes 141 is defined in the two side lower hooks 14 respectively, corresponding to the shafts 161 of the actuators 16. The actuators 16 are controlled by the control panel 18. The actuators 16 can push the shafts 161 through the respective holes 141. A pair of pivot pedestals 121 is upwardly formed near each of opposite side edges of the top wall 12. Three aligned and spaced rear pivot pedestals 123 are upwardly formed near a rear edge of the top wall 12, and are pivotably attached to the cover 30.

The cover 30 is generally box-shaped, and is adapted to accommodate a testing device (not shown). A horizontal beam 32 is formed on a front face of the cover 30. Three spaced L-shaped blocks 321 protrude upwardly from the beam 32. A spring pin 321a protrudes forwardly from a vertical part of each of the blocks 321. A second sensor 321b is mounted on a middle one of the blocks 321, and over a middle one of the spring pins 321a. The second sensor 321b sends signals to the control panel 18. Three spaced posts 323 depend from the beam 32. The posts 323 contact the horizontal parts respectively of the lower hooks 14, for supporting the cover 30 when the cover 30 is in a closed position. Three upper hooks 34 are pivotably attached in the beam 32, corresponding to the three lower hooks 14. Each upper hook 34 is L-shaped, and comprises a horizontal part and vertical part. The upper hooks 34 contact the spring pins 321a respectively. A connecting bar 341 connects between the upper hooks 34 below the beam 32. A pair of pivot pedestals 36 is formed on opposite side faces of the cover 30 respectively, corresponding to the pairs of pivot pedestals 121 of the base 10.

Each first cylinder 40 comprises a cylinder casing 41 and a piston rod 43. A medium such as gas or oil is pumped into the cylinder casing 41, for pushing the piston rod 43 along the cylinder casing 41. One end of each first cylinder 40 is pivotably fixed to a corresponding pivot pedestal 36 of the cover 30, and an opposite end of each first cylinder 40 is pivotably fixed to a corresponding forward one of the pivot pedestals 121 of the base 10. The piston rods 43 are movable in the respective cylinder casings 41. A third sensor 41a is mounted at a predetermined position on an outer surface of one of the cylinder casings 41, and a fourth sensor (not shown) is mounted on the corresponding piston rod 43. When said piston rod 43 reaches the predetermined position in said cylinder casing 41, the third sensor 41a is activated by the fourth sensor of the piston rod 43, and the third sensor 41a sends a signal to the control panel 18. Each second cylinder 50 is pivotably fixed to a corresponding pivot pedestal 36, and to a corresponding rearward one of the pivot pedestals 121. Each second cylinder 50 comprises a cylinder casing (not labeled) and a piston rod (not labeled). The second cylinders 50 are hermetically filled with compressed gas.

Referring particularly to FIG. 1, in operation, a user at the control panel 18 starts the actuators 16. The shafts 161 of the actuators 16 are moved outwardly, and extend through the holes 141 of the side lower hooks 14. The shafts 161 push the side upper hooks 34 forwardly, and the upper hooks 34 rotate outwardly to begin disengaging from the lower hooks 14. The upper hooks 34 press the spring pins 321a inwardly toward the blocks 321 until the upper hooks 34 disengage from the lower hooks 14. At this moment, the middle upper hook 34 contacts the second sensor 321b of the middle block 321. The second 321b sensor sends a signal to the control panel 18 indicating that the upper hooks 34 have disengaged from the lower hooks 14. Then the control panel 18 sends a signal to the first cylinders 40. The medium is pumped into the cylinder casings 41, and the piston rods 43 extend and push the cover 30 open. The spring pins 321a rebound back against the upper hooks 34. When the piston rod 43 having the fourth sensor reaches said predetermined place, the third sensor 41a of the corresponding first cylinder 40 is activated by the fourth sensor of the piston rod 43. The third sensor 41a sends a signal to the control panel 18 indicating that the cover 30 is fully opened. The control panel 18 operates to stop pumping of the medium into the first cylinders 41, the piston rods 41 stop, and the cover 30 is maintained in the fully open position.

A printed circuit board (not shown) is placed on the top wall 12 of the base 10 for testing. Then the user at the control panel 18 sends a "close" signal to the first cylinders 40. The piston rods 43 retract back into the cylinder casings 41, and the cover 30 rotates down toward the base 10. The posts 323 contact the lower hooks 14 to support the cover 30, and the upper hooks 34 engage with the lower hooks 14. The horizontal parts of the upper hooks 34 are located under the horizontal parts of the lower hooks 14, and the middle upper hook 34 contacts the first sensor 14a of the middle lower hook 14. The first sensor 14a sends a signal to the control panel 18. The control panel 18 then sends a "test" signal to the testing device in the cover 30. The testing device starts testing the printed circuit board.

During opening and closing of the cover 30, the second cylinders 50 act as springs. When the cover 30 is opened, the compressed gas in the cylinder casings of the second cylinders 50 expands and extends the corresponding piston rods. This helps open the cover 30 quickly. When the cover 30 is closed, the gas is compressed once again so as to make the cover 30 close steadily. In alternative embodiments, the second sensor 321b of the cover 30 can be mounted on any of the blocks 321. The first sensor 14a of the base 10 can be mounted on any of the lower hooks 14. If desired, more than one second sensor 321b can be mounted on the cover 30, and more than one first sensor 14a can be mounted on the base 10.

While the present invention has been illustrated by the description of preferred embodiments thereof, and while the preferred embodiments have been described in considerable detail, it is not intended to restrict or in any way limit the scope the appended claims to such detail. Additional advantages and modifications within the spirit and scope of the present invention will readily appear to those skilled in the art. Therefore, the present invention is not limited to the specific details and illustrative examples shown and described.

What is claimed is:

1. A tester comprising:
    a base comprising a top wall and a control panel, at least one first fastener provided at the top wall adjacent the control panel, a first sensor arranged on the at least one first fastener for sending signals to the control panel, and an actuator arranged adjacent the at least one first fastener, the control panel being adapted to receive and send signals;
    a cover pivotably attached to the base, at least one second fastener provided on the cover to engage with the at least one first fastener of the base, a second sensor arranged on the cover for sending signals to the control panel; and
    at least one first cylinder pivotably attached to the base and the cover respectively to open and close the cover with respect to the base;
    wherein the actuator is controlled by the control panel to disengage the at least one first fastener from the at least one second fastener, and the first and second sensors are respectively activated by the at least one second fastener to indicate to the control panel if the at least one second fastener is in engagement with the at least one first fastener or not, thereby accordingly controlling the at least one first cylinder to open and close the cover with respect to the base.

2. The tester as claimed in claim 1, wherein a plurality of spaced first fasteners are arranged on the top wall, each of the first fasteners is a first hook, and the first sensor of the base is mounted on a middle one of the first hooks.

3. The tester as claimed in claim 2, wherein a hole is defined in each of side first hooks located at opposite sides of the middle first hook, a pair of actuators is arranged behind the side first hooks, and each of the actuators comprises a slidable shaft extending through a corresponding hole.

4. The tester as claimed in claim 2, wherein a beam is arranged at a front of the cover, a plurality of spaced posts depends from the beam, and the posts are supported on the first hooks respectively when the cover is in a closed position.

5. The tester as claimed in claim 4, wherein a plurality of second fasteners is provided on the cover, each of the second fasteners is a second hook, and the second hooks are pivotably attached to the beam for engaging with the first hooks respectively.

6. The tester as claimed in claim 5, wherein a bar connects between the second hooks.

7. The tester as claimed in claim 6, wherein a plurality of blocks is upwardly arranged on the beam corresponding to the second hooks, the blocks are positioned behind the second hooks respectively, the second sensor of the cover is arranged on a middle one of the blocks, and a plurality of spring pins is connected between the blocks and the second hooks respectively.

8. The tester as claimed in claim 1, wherein the tester comprises a pair of first cylinders, each of the first cylinders is attached to lateral sides of the tester respectively, and each of the first cylinders comprises a cylinder casing and a piston rod.

9. The tester as claimed in claim 1, further comprising a pair of second cylinders.

10. A tester comprising:
    a base comprising a top wall and a control panel, at least one first fastener on the top wall,
    a first sensor arranged on the at least one first fastener for sending signals to the control panel,
    an actuator arranged adjacent the at least one first fastener, the control panel being adapted to receive and send signals;

a cover pivotably attached to the base, at least one second fastener provided on the cover to engage with the at least one first fastener of the base, a second senior arranged on the cover for sending signals to the control panel; and at least one first cylinder attached to the base and the cover respectively for opening and closing the cover with regard to the base;

wherein the actuator is controlled by the control panel to disengage the at least one first fastener from the at least one second fastener, and the first and second sensors are respectively activated by the at least one second fastener so as to control the at least one first cylinder to open and close the cover relative to the base.

* * * * *